US010153263B2

(12) United States Patent
Yang et al.

(10) Patent No.: US 10,153,263 B2
(45) Date of Patent: Dec. 11, 2018

(54) PATTERNED MATERIAL LAYER AND PATTERNING METHOD

(71) Applicant: MACRONIX International Co., Ltd., Hsinchu (TW)

(72) Inventors: Chin-Cheng Yang, Hsinchu (TW); Chia-Hua Lin, Hsinchu (TW); Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/861,933

(22) Filed: Sep. 22, 2015

(65) Prior Publication Data

US 2017/0084597 A1  Mar. 23, 2017

(51) Int. Cl.
*H01L 27/02* (2006.01)
*H01L 29/06* (2006.01)
*G06F 17/50* (2006.01)

(52) U.S. Cl.
CPC ...... *H01L 27/0207* (2013.01); *G06F 17/5072* (2013.01); *H01L 29/0657* (2013.01)

(58) Field of Classification Search
CPC .................................................. H01L 23/49811
See application file for complete search history.

(56) References Cited

U.S. PATENT DOCUMENTS 5,641,946 A * 6/1997 Shim, II ............... H01L 21/4853
174/260
2012/0241965 A1* 9/2012 Hu .......................... H01L 24/81
257/773

* cited by examiner

*Primary Examiner* — Tran Tran
(74) *Attorney, Agent, or Firm* — J.C. Patents (57) ABSTRACT

A structure of a patterned material layer including separate patterns arranged in rows and columns is described. The separate patterns in at least one row including the outmost row each have a larger dimension in the column direction than the separate patterns in the other rows. The separate patterns in at least one column including the outmost column each have a larger dimension in the row direction than the separate patterns in the other columns.

12 Claims, 7 Drawing Sheets

PATTERNED MATERIAL LAYER AND PATTERNING METHOD

BACKGROUND OF THE INVENTION

Field of Invention

This invention relates to an integrated circuit (IC) process, and particularly relates to a patterned material layer with a particular boundary layout structure, and a patterning method for defining patterns of the above patterned material layer on a substrate.

Description of Related Art

As the pitch of patterns in IC process becomes smaller, the lithography illumination mode needs a very strong off-axis illumination (OAI). Meanwhile, defining an array of hole or pillar patterns is a challenge for the lithography process, especially when the pitch of the patterns is near the exposure tool limitation (k1<0.3).

The challenge exists not only because the array is dense, but also because the transfer of boundary holes or pillars tends to be bad and problems such as blind holes, hole bridging, worse profile, worse critical dimension uniformity (CDU) in the after-development critical dimension (DCD) or the after-etching critical dimension (ECD), and smaller process windows may occur in the lithography process and the etching process.

SUMMARY OF THE INVENTION

Accordingly, this invention provides a patterned material layer comprising a plurality of separate patterns arranged in rows and columns, in which boundary patterns are easier to be successfully transferred from a photomask.

This invention also provides a patterning method for defining the separate patterns of the patterned material layer of this invention.

The patterned material layer of this invention comprises a plurality of separate patterns arranged in rows and columns, wherein the separate patterns in at least one row including the outmost row each have a larger dimension in the column direction than the separate patterns in other rows, and the separate patterns in at least one column including the outmost column each have a larger dimension in the row direction than the separate patterns in other columns.

In an embodiment, the above patterned material layer includes a layer defined by a patterned mask layer through etching. In another embodiment, the above patterned material layer includes a patterned photoresist layer.

In addition, the separate patterns may include contact hole patterns or pillar patterns.

The patterning method of this invention is described as follows. An initial layout design for the plurality of separate patterns is provided. The initial layout design is modified in a manner such that the separate patterns in at least one row including the outmost row each have a larger dimension in the column direction than the separate patterns in the other rows, and the separate patterns in at least one column including the outmost column each have a larger dimension in the row direction than the separate patterns in the other columns. A photomask layout design is derived with the modified layout design as a target. A photomask is taped out according to the photomask layout design and then used to define the separate patterns on a substrate and form the above patterned material layer of this invention.

In an embodiment of the patterning method, the initial layout design comprises an initial ADI (after-development inspection)/AEI (after-etching inspection) layout design, and the modified layout design comprises a modified ADI/AEI layout design. It is particularly noted that in this specification, the so-called "modified ADI/AEI layout design" is the design of a layout intended to be obtained after the development, or the design of a layout intended to be obtained after the etching, or a mixed design of both.

Since the separate patterns in at least one row including the outmost row each have a larger dimension in the column direction and the separate patterns in at least one column including the outmost column each have a larger dimension in the row direction in the design of the patterned material layer of this invention, the photomask layout made with the design as a target have a similar modification, so the boundary patterns can be transfer more easily without problems such as blind holes, hole bridging, worse profile, worse CDU and a smaller process.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are not intended to limit the scope thereof. For example, though the row direction is the x-direction and the column direction is the y-direction in the embodiments, it is also possible that the row direction is the y-direction and the column direction is the x-direction in this invention.

In embodiments according to an aspect of this invention, only the separate patterns in the outmost row each have a larger dimension in the column direction than the separate patterns in the other rows, and only the separate patterns in the outmost column each have a larger dimension in the row direction than the separate patterns in the other columns. Such embodiments include the first to third embodiments described below.

Figure 1:
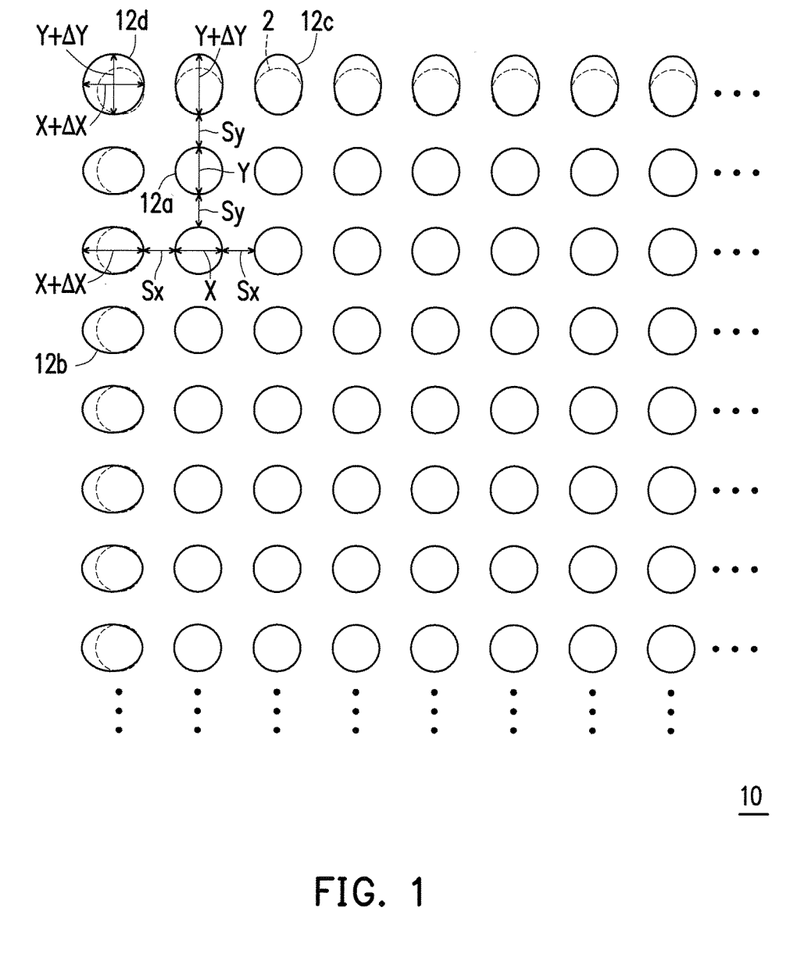
FIG. 1 illustrates a local layout of a patterned material layer according to a first embodiment of this invention.

FIG. 1 illustrates a local layout of a patterned material layer according to the first embodiment of this invention.

Referring to FIG. 1, in the layer 10 (when the separate patterns include hole patterns) or on the substrate 10 (when the separate patterns include pillar patterns), only the separate patterns 12c in the outmost row each have a larger dimension Y+ΔY in the y-direction than the separate patterns 12a in the other rows, and only the separate patterns 12b in the outmost column each have a larger dimension X+ΔX in the x-direction than the separate patterns 12a in the other columns. The separate pattern 12d in the outmost row and also in the outmost column has both the DCD/ECD modifications, i.e., the dimension Y+ΔY in the y-direction and the dimension X+ΔX in the x-direction. It is noted that the initial separate patterns 2 without the dimensional modifications are shown by dashed lines.

The spacing (Sy) between the outmost row of separate patterns 12c and the neighboring row of separate patterns 12a among the other rows is equal to the spacing (Sy) between any two of the other rows of separate patterns 12a, and the spacing (Sx) between the outmost column of separate patterns 12b and the neighboring column of separate patterns 12a among the other columns is equal to the spacing (Sx) between any two of the other columns of separate patterns 12a.

The layer 10 having hole patterns therein may be a layer defined by a patterned mask layer through etching, and such layer may be a wafer layer that will remain in the integrated circuit, such as a dielectric layer having contact holes therein, or may be a hard mask layer that is for defining an underlying layer and will be removed after being used for masking. The contact holes may be formed for containing the contact plugs of a capacitor array in DRAM or of a flash memory for 2D and 3D devices. The layer 10 may alternatively be a patterned photoresist layer, which also will be removed after being used for masking.

The separate patterns 12a to 12d including pillar patterns formed on the substrate 10 may constitute a layer defined by a patterned mask layer through etching, and such layer may be a wafer layer that will remain in the integrated circuit, or a hard mask layer that is for defining another layer and will be removed after being used for masking. The separate patterns 12a to 12d including pillar patterns formed on the substrate 10 may alternatively constitute a patterned photoresist layer, which will be removed after being used for masking.

When the layer 10 includes or the separate patterns 12a to 12d constitute a patterned photoresist layer, the larger dimension in the column direction and the larger dimension in the row direction mean a larger DCD (after-development critical dimension). When the layer 10 includes or the separate patterns 12a to 12d constitute a layer that is defined by a patterned mask layer through etching, the larger dimension in the column direction and the larger dimension in the row direction mean a larger ECD (after-etching critical dimension).

Figure 2:
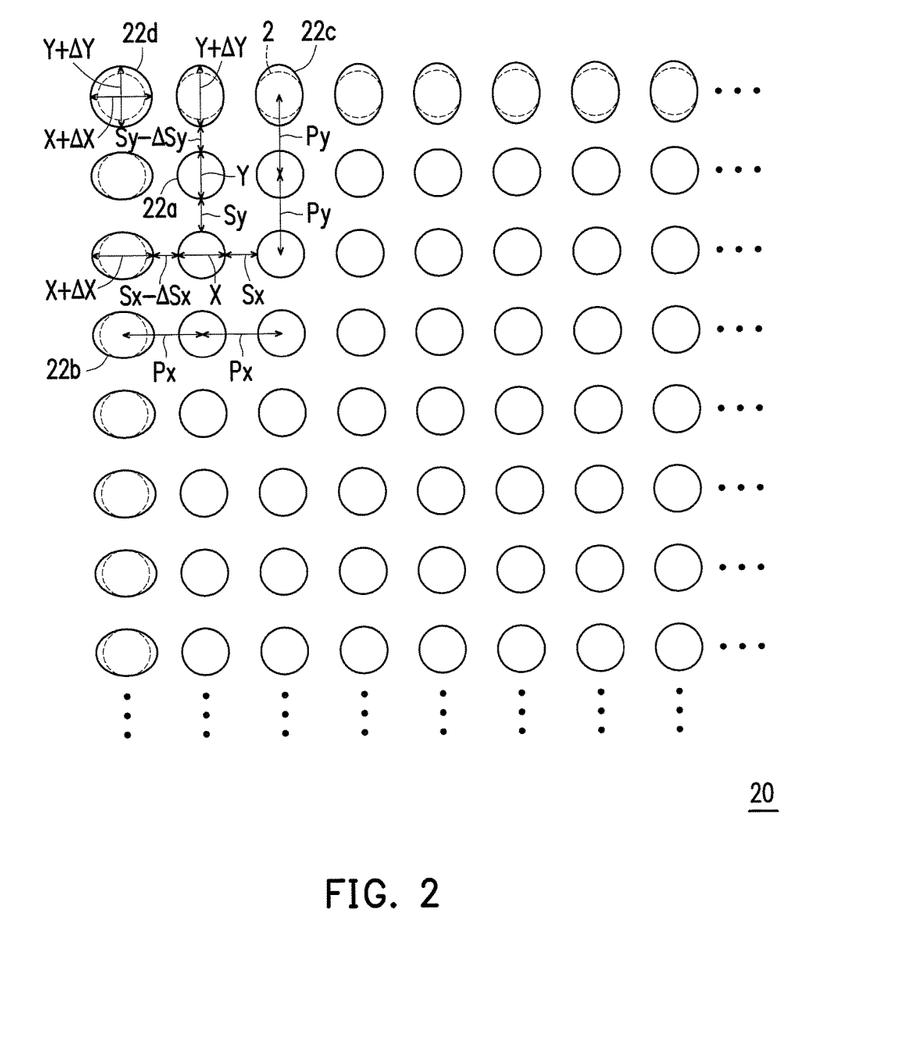
FIG. 2 illustrates a local layout of a patterned material layer according to a second embodiment of this invention.

FIG. 2 illustrates a local layout of a patterned material layer according to the second embodiment of this invention.

Referring to FIG. 2, except that the reference numerals are changed from 10, 12a, 12b, 12c and 12d to 20, 22a, 22b, 22c and 22d, the second embodiment is different from the first embodiment in that the pitch (Py) between the outmost row of separate patterns 22c and the neighboring row of separate patterns 22a among the other rows is equal to the pitch (Py) between any two of the other rows of separate patterns 22a, the pitch (Px) between the outmost column of separate patterns 22b and the neighboring column of separate patterns 22a among the other columns is equal to the pitch (Px) between any two of the other columns of separate patterns 22a, the spacing (Sy−ΔSy) between the outmost row of separate patterns 22c and the neighboring row of separate patterns 22a among the other rows is smaller than the spacing (Sy) between any two of the other rows of separate patterns 22a, and the spacing (Sx−ΔSx) between the outmost column of separate patterns 22b and the neighboring column of separate patterns 22a among the other columns is smaller than the spacing (Sx) between any two of the other columns of separate patterns 22a.

Figure 3:
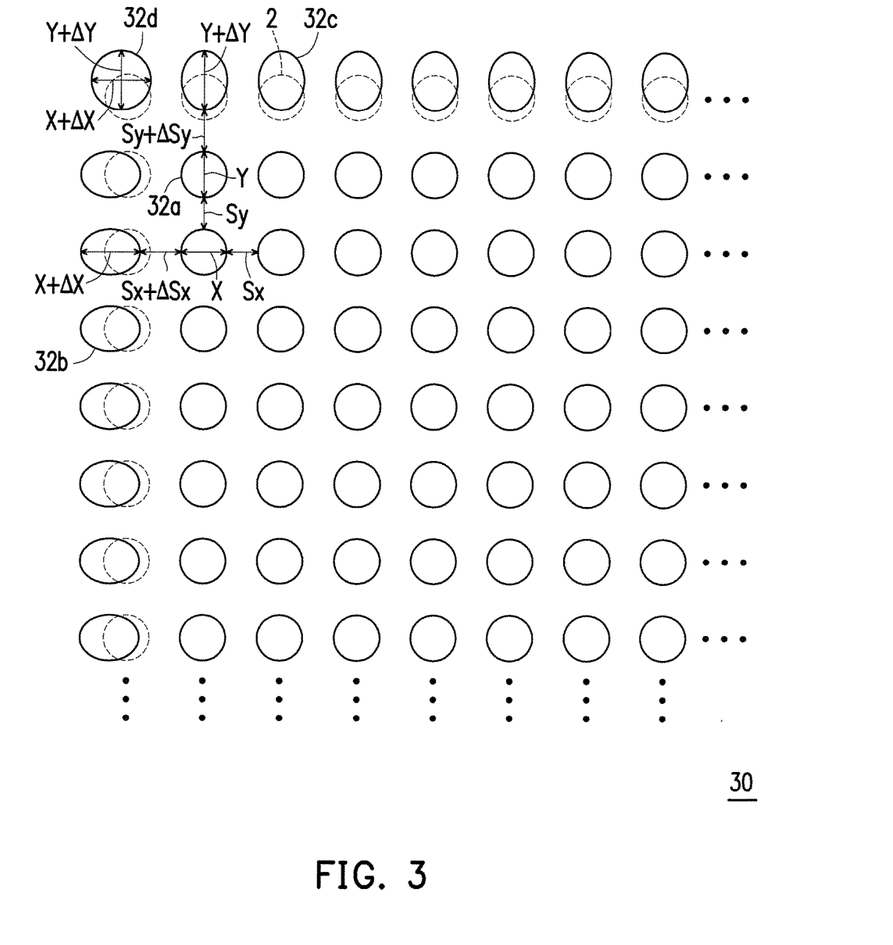
FIG. 3 illustrates a local layout of a patterned material layer according to a third embodiment of this invention.

FIG. 3 illustrates a local layout of a patterned material layer according to a third embodiment of this invention.

Referring to FIG. 3, except that the reference numerals are changed from 10, 12a, 12b, 12c and 12d to 30, 32a, 32b, 32c and 32d, the third embodiment is different from the first embodiment in that the spacing (Sy+ΔSy) between the outmost row of separate patterns 32c and the neighboring row of separate patterns 32a among the other rows is larger than the spacing (Sy) between any two of the other rows of separate patterns 32a, and the spacing (Sx+ΔSx) between the outmost column of separate patterns 32b and the neighboring column of separate patterns 32a among the other columns is larger than the spacing (Sx) between any two of the other columns of separate patterns 32a.

The cases where the separate patterns in more than one rows including the outmost row each have a larger dimension in the column direction and/or the separate patterns in more than one columns including the outmost column each have a larger dimension in the row direction include the fourth and the fifth embodiments as described below.

Figure 4:
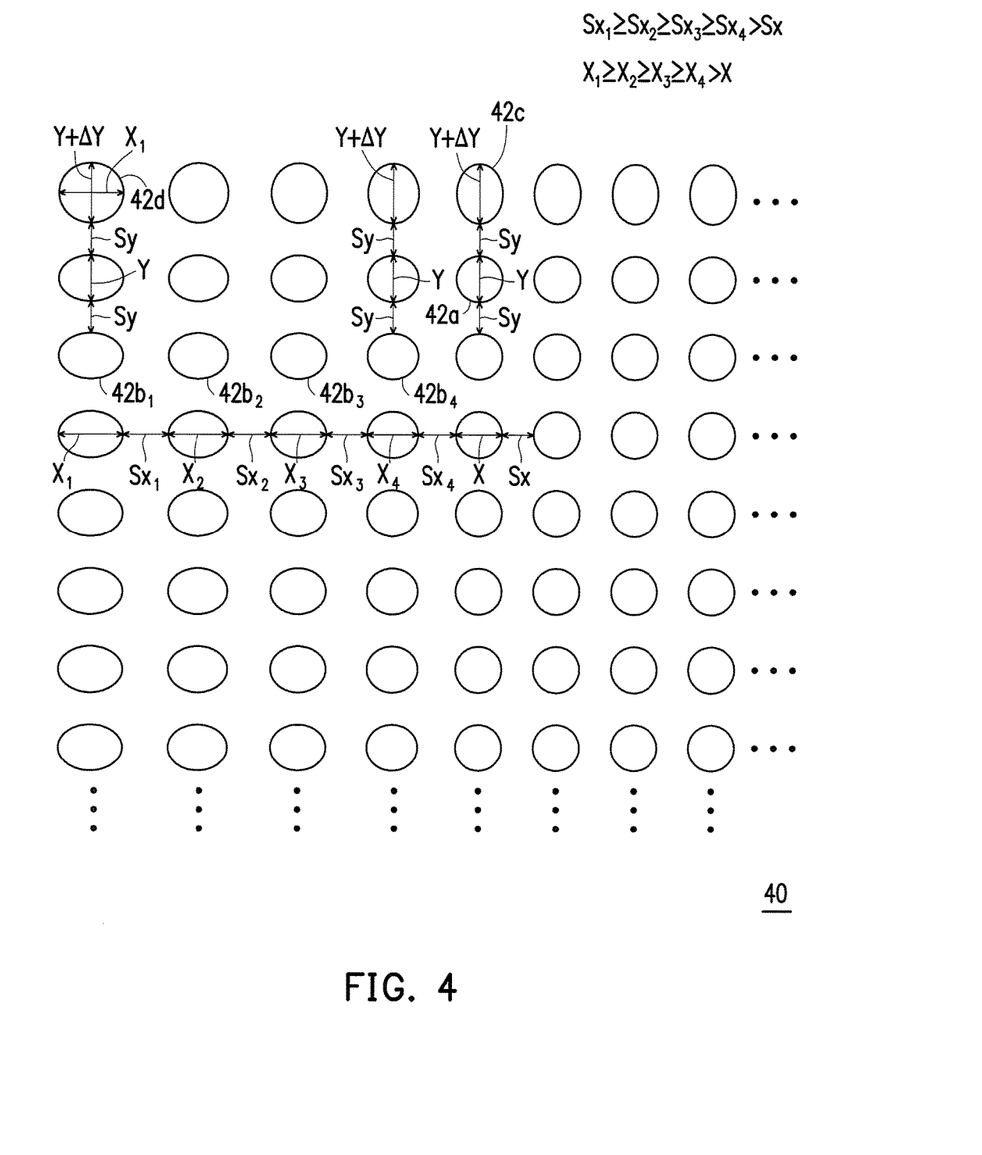
FIG. 4 illustrates a local layout of a patterned material layer according to a fourth embodiment of this invention.

FIG. 4 illustrates a local layout of a patterned material layer according to the fourth embodiment of this invention.

Referring to FIG. 4, in the layer 40 (when the separate patterns include hole patterns) or on the substrate 40 (when the separate patterns include pillar patterns), only the separate patterns 42c in the outmost row each have a larger dimension Y+ΔY in the y-direction than the separate patterns 42a in the other rows, and the separate patterns $42b_1$ to $42b_n$ in n (n≥2) columns including the outmost column each have a larger dimension (any of $X_1$ to $X_n$) in the x-direction than the separate patterns 42a in the other columns, wherein indexing of 1 to n starts from the outmost column. The value of n in the case illustrated in FIG. 4 is 4, but the value of n in this invention is not limited to 4.

The spacing $Sx_i$ (i=1 to n−1) between the i-th column of separate patterns $42b_i$ and the (i+1)-th column of separate patterns $42b_{i+1}$ is larger than or equal to the spacing $Sx_{i+1}$ between the (i+1)-th column of separate patterns $42b_{i+1}$ and the (i+2)-th column of separate patterns, and the spacing $Sx_n$ between the n-th column of separate patterns $42b_n$ and the neighboring column of separate pattern 42a among the other columns is larger than the spacing Sx between any two of the other columns of separate pattern 42a.

In addition, the x-directional dimension $X_i$ (i=1 to n−1) of the separate patterns $42b_i$ in the i-th column is larger than or equal to the x-directional dimension $X_{i+1}$ of the separate patterns $42b_{i+1}$ in the (i+1)-th column, and the x-directional dimension $X_n$ of the separate patterns $42b_n$ in the n-th column is larger than the x-direction dimension X of the separate patterns 42a in the other columns. The separate pattern 42d in the outmost row and also in the outmost column has the dimension Y+ΔY in the y-direction and the dimension $X_1$ in the x-direction.

In some cases, $Sx_i$ (i=1 to n−1) is larger than $Sx_{i+1}$, and/or $X_i$ (i=1 to n−1) is larger than $X_{i+1}$. That is, the x-directional inter-pattern spacing gradually increases from the n-th column toward the outmost column as the first column, and/or the x-directional dimension of separate pattern gradually increases from the n-th column toward the outmost column.

Figure 5:
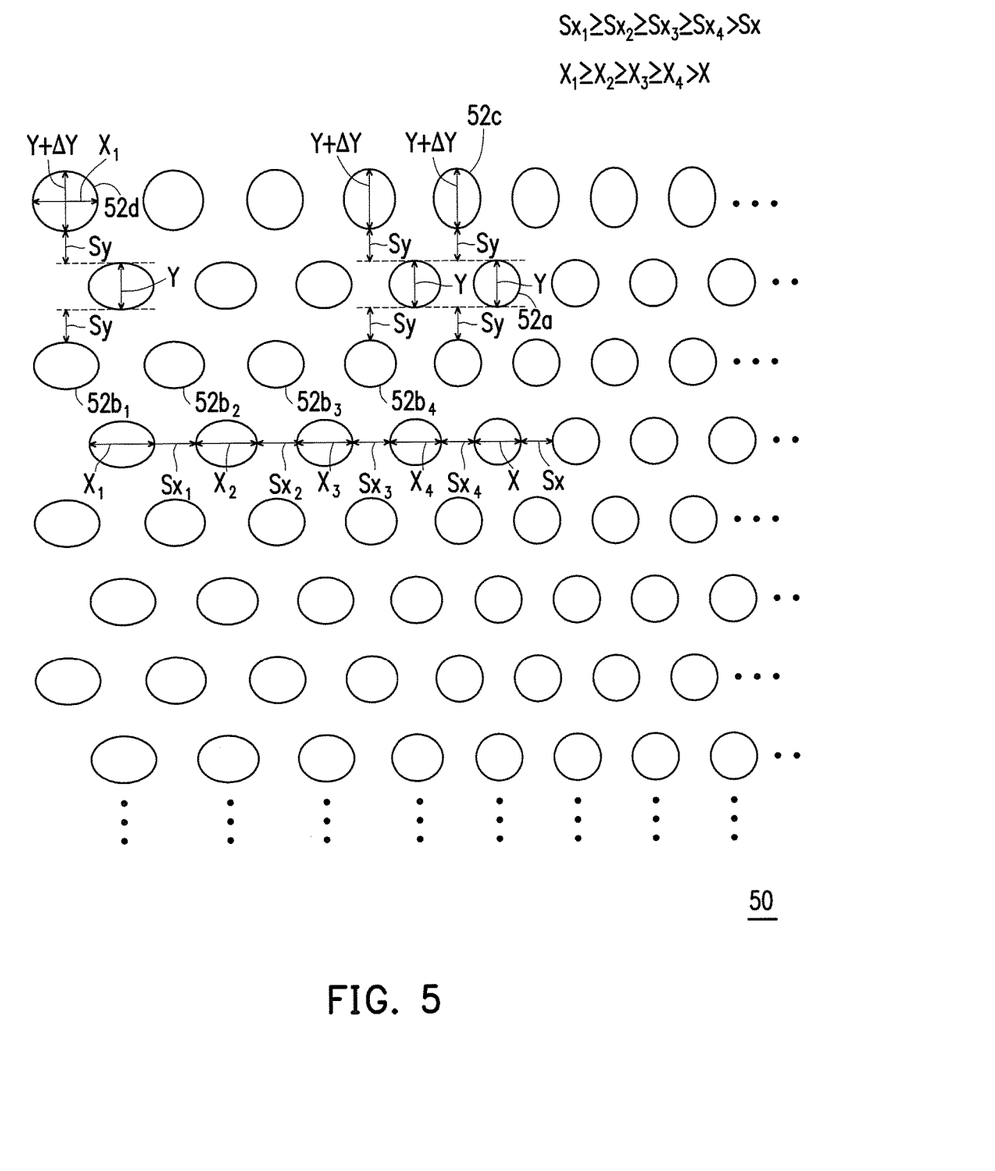
FIG. 5 illustrates a local layout of a patterned material layer according to a fifth embodiment of this invention.

FIG. 5 illustrates a local layout of a patterned material layer according to the fifth embodiment of this invention.

Referring to FIG. 5, except that the reference numerals are changed from 40, 42a, $42b_i$ (i=1−n), 42c and 42d to 50, 52a, $52b_i$ (i=1−n), 52c and 52d, the fifth embodiment is different from the fourth embodiment in that the separate patterns in each column of separate patterns are arranged in a staggered manner. It is also possible that $Sx_i$ (i=1 to n−1) is larger than $Sx_{i+1}$ and/or $X_i$ (i=1 to n−1) is larger than $X_{i+1}$, i.e., that the x-directional inter-pattern spacing gradually increases from the n-th column toward the outmost column as the first column, and/or the x-directional dimension of separate pattern gradually increases from the n-th column toward the outmost column.

Figure 6:
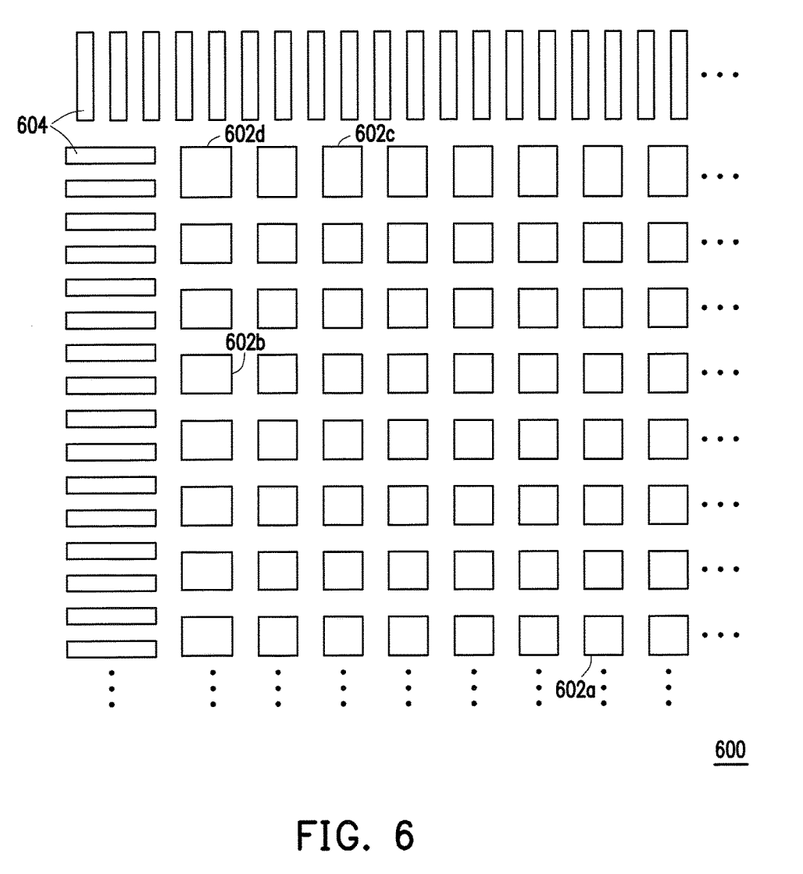
FIG. 6 illustrates an exemplary photomask layout for forming the patterned material layer of this invention.

FIG. 6 illustrates an exemplary photomask layout for forming the patterned material layer of this invention.

Referring to FIG. 6, the mask patterns on a photomask includes separate patterns 602a corresponding to the non-modified separate patterns in the design of the intended patterned material layer, separate patterns 602b corresponding to the at least one column of separate patterns having a larger x-directional dimension in the design of the intended patterned material layer, separate patterns 602c corresponding to the at least one row of separate patterns having a larger y-directional dimension in the design of the intended patterned material layer, and a corner separate pattern 602d corresponding to the corner separate pattern in the design of the intended patterned material layer. The mask patterns may also include x-directional and y-directional scattering bars (SB) 604 which are narrower and denser than the exposure tool limitation so that the patterns thereof cannot be transferred to the photoresist layer, so as to improve the transfer of the boundary separate patterns 602b, 602c and 602d.

Figure 7:
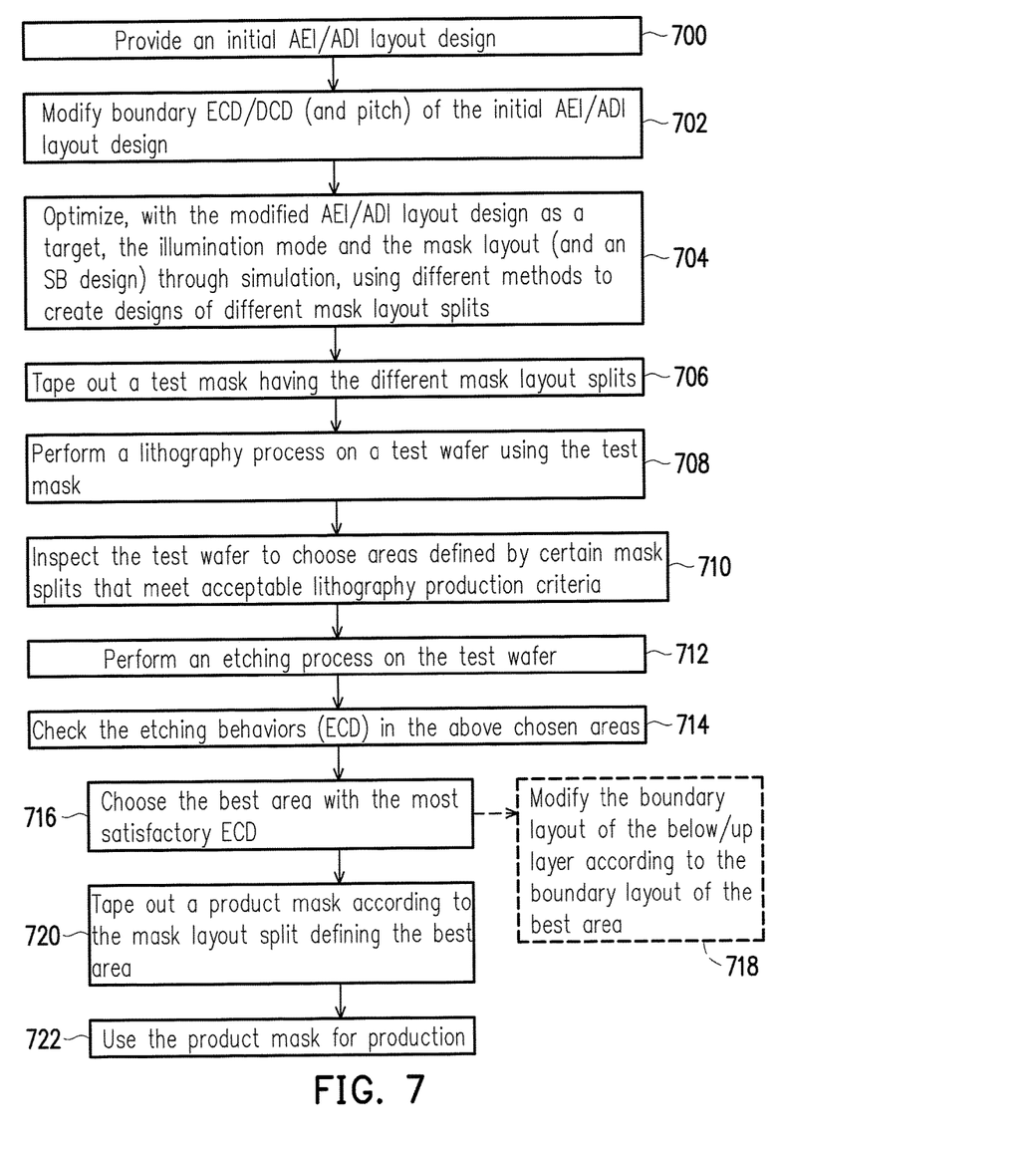
FIG. 7 is a process flow of an exemplary patterning method for defining a plurality of separate patterns arranged in rows and columns according to an embodiment of this invention.

FIG. 7 a process flow of an exemplary patterning method for defining a plurality of separate patterns arranged in rows and columns according to an embodiment of this invention.

Referring to FIG. 7, in step 700, an initial ADI/AEI layout design is provided. As the separate patterns to be transferred are contact hole patterns, for example, they usually have a uniform CD and a uniform pitch in the initial ADI/AEI layout design.

In next step 702, the boundary ECD/DCD (and pitch) of the initial ADI/AEI layout design is modified. The modification may be performed in the manner as shown in any of FIGS. 1-5, or in other manner meeting the essential requirement that the separate patterns in at least one row including the outmost row each have a larger dimension in the column direction than the separate patterns in the other rows, and the separate patterns in at least one column including the outmost column each have a larger dimension in a row direction than the separate patterns in the other columns.

In next step 704, with the modified ADI/AEI layout design as a target, the illumination mode and the mask layout (and the SB design) are optimized through simulation, using different optimization methods to derive designs of different mask layout splits. The optimization includes optical proximity correction (OPC) and so on.

In next step 706, a test photomask having the different mask layout splits thereon is taped out, usually by using the e-beam writing technique. In next step 708, a lithography process is performed on a test wafer using the test mask, so as to transfer the transferable patterns on the test photomask to a photoresist layer on the test wafer.

In next step 710, the test wafer is inspected to choose areas defined by certain mask splits that meet acceptable lithography production criteria. This inspection is namely an after-development inspection (ADI).

In next step 712, an etching process is performed on the test wafer, wherein the etching process may be a plasma anisotropic etching process. In next step 714, the etching behaviors (ECD) in the above chosen areas are checked. The checking belongs to an after-etching inspection (AEI). In next step 716, the best area with the most satisfactory ECD is chosen, which corresponds to the best mask layout split for transferring the patterns of the modified ADI/AEI layout design. After step 716, if required, the boundary layout of the below/up layer is modified according to the boundary layout of the best area (step 718).

In step 720, a product photomask is taped out according to the mask layout split defining the best area. In step 722, the product photomask is used for production, so the target layout of the plurality of separate patterns arranged in rows and columns with the boundary modification of this invention is formed on each product wafer.

Since the separate patterns in at least one row including the outmost row each have a larger dimension in the column direction and the separate patterns in at least one column including the outmost column each have a larger dimension in the row direction in the design of the patterned material layer in each of the above and other embodiments of this invention, the boundary patterns can be transfer more easily without problems such as blind holes, hole bridging, worse profile, worse CDU and a smaller process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A patterned material layer, comprising:
a plurality of separate patterns arranged in rows and columns, wherein the separate patterns in at least one row including an outmost row each have a larger dimension in a column direction than the separate patterns in other rows, and the separate patterns in at least one column including an outmost column each have a larger dimension in a row direction than the separate patterns in other columns,
wherein the patterned material layer exists in an integrated circuit, the patterned material layer is a wafer layer, and a pitch of the separate patterns is sub-micron.

2. The patterned material layer of claim 1, which includes a layer defined by a patterned mask layer through etching.

3. The patterned material layer of claim 2, wherein the separate patterns comprise contact hole patterns.

4. The patterned material layer of claim 2, wherein the separate patterns comprise pillar patterns.

5. The patterned material layer of claim 1, wherein only the separate patterns in the outmost row each have the larger dimension in the column direction than the separate patterns in the other rows, and only the separate patterns in the outmost column each have the larger dimension in the row direction than the separate patterns in the other columns.

6. The patterned material layer of claim 5, wherein
a first spacing between the outmost row of separate patterns and a neighboring row of separate patterns among the other rows is equal to a second spacing between any two of the other rows of separate patterns, and
a third spacing between the outmost column of separate patterns and a neighboring column of separate patterns among the other columns is equal to a fourth spacing between any two of the other columns of separate patterns.

7. The patterned material layer of claim 5, wherein
a first spacing between the outmost row of separate patterns and a neighboring row of separate patterns among the other rows is smaller than a second spacing between any two of the other rows of separate patterns, and a third spacing between the outmost column of separate patterns and a neighboring column of separate patterns among the other columns is smaller than a fourth spacing between any two of the other columns of separate patterns.

8. The patterned material layer of claim 5, wherein a first spacing between the outmost row of separate patterns and a neighboring row of separate patterns among the other rows is larger than a second spacing between any two of the other rows of separate patterns, and a third spacing between the outmost column of separate patterns and a neighboring column of separate patterns among the other columns is larger than a fourth spacing between any two of the other columns of separate patterns.

9. The patterned material layer of claim 1, wherein only the separate patterns in the outmost row each have a larger dimension in the column direction than the separate patterns in the other rows, the separate patterns in n (n≥2) columns including the outmost column each have a larger dimension in the row direction than the separate patterns in the other columns, wherein indexing of 1 to n starts from the outmost column, a spacing $S_i$ (i=1 to n−1) between the i-th column of separate patterns and the (i+1)-th column of separate patterns is larger than or equal to a spacing $S_{i+1}$ between the (i+1)-th column of separate patterns and the (i+2)-th column of separate patterns, and a spacing $S_n$ between the n-th column of separate patterns and an inner neighboring column of separate patterns among the other columns is larger than a spacing between any two of the other columns, and a row-direction dimension $D_i$ (i=1 to n−1) of the separate patterns in the i-th column is larger than or equal to a row-direction dimension $D_{i+1}$ of the separate patterns in the (i+1)-th column, and a row-direction dimension $D_n$ of the separate patterns in the n-th column is larger than a row-direction dimension of the separate patterns in the other columns.

10. The patterned material layer of claim 9, wherein $S_i$ (i=1 to n−1) is larger than $S_{i+1}$ and/or $D_i$ (i=1 to n−1) is larger than $D_{i+1}$.

11. The patterned material layer of claim 9, wherein the separate patterns in each column of separate patterns are arranged in a staggered manner.

12. The patterned material layer of claim 11, wherein $S_i$ (i=1 to n−1) is larger than $S_{i+1}$ and/or $D_i$ (i=1 to n−1) is larger than $D_{i+1}$.

* * * * *